United States Patent
Rencher et al.

(10) Patent No.: US 7,281,178 B2
(45) Date of Patent: *Oct. 9, 2007

(54) SYSTEM AND METHOD FOR WRITE-ENABLE BYPASS TESTING IN AN ELECTRONIC CIRCUIT

(75) Inventors: Michael A. Rencher, Corvallis, OR (US); James R. Emmert, Corvallis, OR (US)

(73) Assignee: Avago Technologies General IP Pte Ltd, Singapore (SG)

( * ) Notice: Subject to any disclaimer, the term of this patent is extended or adjusted under 35 U.S.C. 154(b) by 266 days.

This patent is subject to a terminal disclaimer.

(21) Appl. No.: 10/892,049

(22) Filed: Jul. 15, 2004

(65) Prior Publication Data
US 2006/0015784 A1    Jan. 19, 2006

(51) Int. Cl.
*G11C 29/00* (2006.01)
(52) U.S. Cl. ...................................... 714/718
(58) Field of Classification Search .................. None
See application file for complete search history.

(56) References Cited

U.S. PATENT DOCUMENTS

| | | | |
|---|---|---|---|
| 2004/0120181 A1* | 6/2004 | Fukatsu | 365/154 |
| 2004/0128604 A1* | 7/2004 | Guettaf | 714/741 |

* cited by examiner

*Primary Examiner*—Cynthia Britt
*Assistant Examiner*—John J. Tabone, Jr.

(57) ABSTRACT

A system and method for write-enable bypass testing in an electronic circuit. According to one embodiment, the integrated circuit that includes a memory block having at least one input and at least one output. At least one input is associated with a block of input logic and at least one output is associated with a block of output logic. The integrated circuit also includes a test circuit coupled to the memory block and operable to verify the block of input logic and the block of output logic while at the same time not impacting the timing of the integrated circuit. As such a signal propagating through just the input logic, the memory block and the output logic does so in an amount of time substantially similar the time it takes to propagate through the input logic, the memory block, the output logic, and the test circuit.

20 Claims, 6 Drawing Sheets

SYSTEM AND METHOD FOR WRITE-ENABLE BYPASS TESTING IN AN ELECTRONIC CIRCUIT

BACKGROUND OF THE INVENTION

Application Specific Integrated Circuits (ASICS) in conjunction with Electronic Circuit Boards (ECBs) are prevalent in today's electronics as they are becoming more functional and easier and cheaper to manufacture. As a result, the need to test an ASIC or ECB after manufacture for the purposes of quality assurance has arisen. Various tests involving forced logical values at electronic circuit inputs can be performed on the ASIC or ECB to verify that the design has been implemented correctly. Typically, because the design is known beforehand, a forced logical value at each input point will yield an expected logical value at each output which can be monitored to verify the expected results with respect to every possible combination of input values.

In the past, a technician would typically connect each input of an electronic circuit to be tested to a logic-value generator and each output to a logic-value reader. Then, the technician could force the inputs to a specific pattern of logical values (e.g., ones and zeroes) to determine if the output points behaved as expected. This, of course, becomes very time and labor intensive for larger ASICs and ECBs. As such, tools, such as an Automatic Test Pattern Generator (ATPG), were developed to alleviate the time and labor involved. With an ATPG, the technician only needs to configure the ATPG once with the correct parameters for the electronic circuit to be tested and then place it in the ATPG. The ATPG is then able to test the electronic circuit using every possible combination of inputs to verify expected outputs. This test, which is sometimes called a scan vector test or simply, scan vectors, may be easily repeated for other similar electronic circuits.

Scan vectors work very well for electronic circuits that only have logical circuitry. However, some electronic circuits also have memory blocks that are not as predictable as logical circuits. More specifically, memory blocks, such as Random Access Memory (RAM), are very difficult to test when part of an electronic circuit because predicting the value at an output of a RAM block based on the input requires knowledge of the values currently stored in the cells of the RAM block. Thus, the technician would again need to individually test each and every input and output without the benefit of automation using an ATPG.

FIG. 1 is a schematic drawing of a conventional electronic circuit having a RAM block 100 that includes associated input logic 110 and output logic 120. The associated input logic 110 and output logic 120 is typically included in a package operable to interface with a larger electronic system (not shown). The input logic 110 and the output logic 120 are typically designed to provide the appropriate logical interface with the RAM block 100 since the RAM block 100 is typically a standard, "off-the-shelf" item. As such, for the larger electronic system to interface with the RAM block 100, input logic 110 and output logic 120 are designed to provide signal paths to and from the RAM block 100. Furthermore, in FIG. 1 and throughout this disclosure, memory blocks, such as RAM block 100 include many inputs and many outputs, but only one input path 101 and one output path 102 is shown for clarity.

As discussed above, predicting the logic value at the output 102 of the RAM block 100 based on the logic value at the input 101 is not easily accomplished in a testing environment. This also makes it difficult to observe the inputs 101 of the RAM block 100. In FIG. 1, two test flip-flops, a launch flip-flop 111 and a capture flip-flop 121, are used to interface the input logic 110 and the output logic 120, respectively. In a typical testing situation, known logic values forced at the launch flip-flop 111 will necessarily cause predictable logic values at the capture flip-flop 121. However, because the RAM block 100 is not predictable, there is no way to verify the design of the input logic 110 and output logic 120 because the logic value at the capture flip-flop 121 cannot be predicted based upon the logic value forced at the launch flip-flop 111. Thus, in an electronic circuit such as in FIG. 1, conventional means for verifying the logical circuitry comprising the input logic 110 and the output logic 120 cannot be used. As a result, the input logic 110 and the output logic 120 remain untested and unverified.

FIG. 2 is a schematic diagram of a conventional electronic circuit having a solution of the past that implements a bypass circuit in conjunction with a RAM block 200. In this solution, a bypass multiplexor 205 is used to select between the actual output signal at the output 202 of the RAM block 200 or a bypass signal on a bypass signal line 230 connected directly to the input of the RAM block 200. A scan mode bit 206 sets the bypass multiplexor 205 to select one signal over the other. By setting the scan mode bit 206 at the multiplexor 205 to a high logic value, a signal on the bypass signal line 230 is allowed to pass through the bypass multiplexor 205 and a signal from the output 202 of the RAM block 200 is ignored. In this manner, a technician can predict exactly how the entire logical path between the input logic 210 and the output logic 220 will behave. Thus, a conventional scan vector test used in an ATPG will be able to verify the input logic 210 and output logic 220 when the scan mode bit 206 is set to a high logic value.

On the other hand, when not in scan mode (i.e., scan mode bit 206 is set to a low logic value), any signal that reaches the input 201 of the RAM block 200 propagates normally through the RAM block 200 and a logic value is generated at the output 202 of the RAM block 200 accordingly. The output logic value passes through the bypass multiplexor 205 to the output logic 220 because the Scan Mode bit 206 is set to a low logic value at the bypass multiplexor 205. At the same time, any signal that propagates on the bypass signal line 230 will terminate at the bypass multiplexor 205 because the scan mode bit 206 is set to a low logic value. As a result, the entire electronic circuit behaves as though no bypass circuit were present.

Some problems, however, present themselves with this solution. One such problem involves timing exceptions that arise when the logical path is tested using a bypass circuit. Typically, during a test using an ATPG to generate scan vectors, it is desirable to do so "at-speed." That is, it is more beneficial to test the electronic circuit at the speed at which it normally operates which implies proper timing with respect to the number of clock cycles and the period of those clock cycles. As such, an electronic circuit having a RAM block 200 between input logic 210 and output logic 220 will take two clock cycles for an operation to complete. During a first clock cycle, a logic value is input to the RAM block 200 and during a second clock cycle, the RAM block 200 generates a logical output value. As a result, the typical operation of the circuit in FIG. 2 requires two clock cycles for signals to propagate from the launch flip-flop 211 to the capture flip-flop 221.

In scan mode (i.e., scan mode bit 206 is set to a high logic value), however, the logic value propagates from the input logic 210 through the bypass signal line 230 to the output logic 220 on a single clock cycle. Thus, a timing problem arises when testing the logical circuits 210 and 220. The timing problem is caused by the fact that the data must propagate through both input logic 210 and output logic 220 in one clock cycle during scan model, while in non-scan mode (scan mode bit 206 is set to a low logic value) the data has almost 2 clock cycles to propagate through the same logic (input logic 210 and output logic 220). Thus, the test results do not accurately reflect the actual performance of the electronic circuit. This problem makes it difficult or impossible to test this particular path "at-speed" with respect to the larger electronic system in which the electronic circuit is part (i.e., the ASIC).

FIG. 3 is a schematic diagram of a conventional electronic circuit that includes a bypass flip-flop 340, between the input logic 310 and the multiplexor 305, which solves the timing issues discussed above with respect to FIG. 2. In this solution, like the one discussed above in FIG. 2, a bypass multiplexor 305 is used to select between the actual output signal at the output 302 of the RAM block 300 or a bypass signal on a bypass signal line 330 connected directly to the input of the RAM block 300. A scan mode bit 306 sets the bypass multiplexor 305 to select one signal over the other. Again, by setting the scan mode bit 306 to a high logic value, a signal from the bypass flip flop 340 is allowed to pass through the bypass mutiplexor 305 and any signal from the output 302 of the RAM block 300 is rejected. In this manner, a technician can predict exactly how the entire logical path between the input logic 310 and the output logic 320 will behave. Thus, a conventional scan vector test using an ATPG will be able to verify the input and output logic 310 and 320 when the scan mode bit 306 is set to a high logic value.

The bypass signal line flip-flop 340 provides a capture device that passes the value of the signal on the input 301 of the RAM block 300 to the multiplexor 305 on a subsequent clock signal. As a result, in scan mode (i.e., when the scan mode bit 306 is set to a high logic value), the signal propagating though the bypass signal line 330 and the bypass signal line flip-flop 340 behave more like the RAM block 300 because two clock cycles are used to fully propagate signals from the launch flip-flop 311 to the capture flip-flop 321.

This solution allows the electronic circuit to be tested "at-speed" with respect to the rest of the electronic system (i.e., the ASIC); however, other problems are still present. In some electronic circuits, the critical path is very important, and any additional circuitry that is inserted into the electronic circuit may affect the critical path, i.e., add time to the propagation of signals through the electronic circuit. As such, the bypass multiplexor 205 and 305 of either FIG. 2 or FIG. 3 may add to the critical path. Typically, an added multiplexor may cause a timing addition of 100 picoseconds or more which is unacceptable for high-performance electronic circuits.

FIG. 4 is a schematic diagram of yet another conventional circuit for testing logic in an electronic circuit that includes a RAM block 400 or other similar memory block. Instead of a bypass multiplexor of the previous solutions in FIG. 2 and FIG. 3, the electronic circuit of FIG. 4 utilizes registered tri-state circuitry. Some RAM blocks 400 or other memory blocks are available with outputs 402 that are tri-state capable.

Devices that are tri-state enabled use an enable bit, such as scan mode bit 406, to set each respective output 402 to be enabled. Thus, when tri-state outputs 402 are enabled (i.e., the scan mode bit 406 is set to a low logic value), the outputs 402 of the RAM block 400 function normally. During a scan test, however, the scan mode bit 406 may be set to a high logic value and the outputs 402 of the RAM block 400 are then disabled. At the same time, a bypass signal line 430 which is connected directly to the inputs 401 of the RAM block 400 are coupled to a bypass tri-state driver 405, such that the signal on the bypass signal line 430 is allowed to pass when the scan mode bit 406 is set to a high logic value. In this manner, a technician can again predict exactly how the entire logical path between the input logic 410 and the output logic 420 will behave because the input signal bypasses the RAM block 400 through the bypass signal line 430 during a scan test. Therefore, a conventional scan vector test in an ATPG will be able to verify the input logic 410 and output logic 420.

The conventional solution of FIG. 4 also suffers from similar problems that the conventional solutions of FIG. 2 and FIG. 3. For example, the solution still requires additional circuitry for the bypass signal line 430 in addition to requiring that the RAM block 400 have tri-state outputs. This requirement then leads to more complicated interfaces with the ATPG which may not be configured to handle tri-state circuitry. Furthermore, devices having tri-state driver outputs maybe more expensive than devices that have normal outputs in terms of size and performance. Additionally, as was the case before, the critical path timing is still impacted because tri-state driver 405 and the bypass flip-flop 440 add loading which will lead to additional propagation time.

SUMMARY OF THE INVENTION

An embodiment of the invention is directed to an integrated circuit that includes a memory block having at least one input and at least one output that wherein a critical path in the integrated circuit exists through the memory block. At least one input is associated with a block of input logic and at least one output is associated with a block of output logic. The integrated circuit further includes a test circuit coupled to the memory block and operable to verify the block of input logic and the block of output logic while at the same time not impacting the critical path of the integrated circuit.

According to one embodiment, the test circuit includes a launch flip-flop operable to force a logic value on the input through the block of input logic, a capture flip-flop operable to read a logic value received from the output through the block of output logic, and a write-enable bypass circuit coupled to the launch flip-flop and the memory block which is operable to force the RAM block into write mode which causes the RAM block inputs to pass through to the outputs.

Such a test circuit is able to be used to verify the logic blocks of an integrated circuit without impacting the critical path of various functional signals in an integrated circuit. As a result, time-critical functions that require time-critical integrated circuits can still use a mass-produced integrated circuit having test circuitry therein for use with a typical ATPG that performs a standard scan vector test.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed above without departing from the spirit and scope of the present invention. The present invention is not intended to be limited to the embodiments shown, but is to be accorded the widest scope consistent with the principles and features disclosed or suggested herein.

Figure 1:
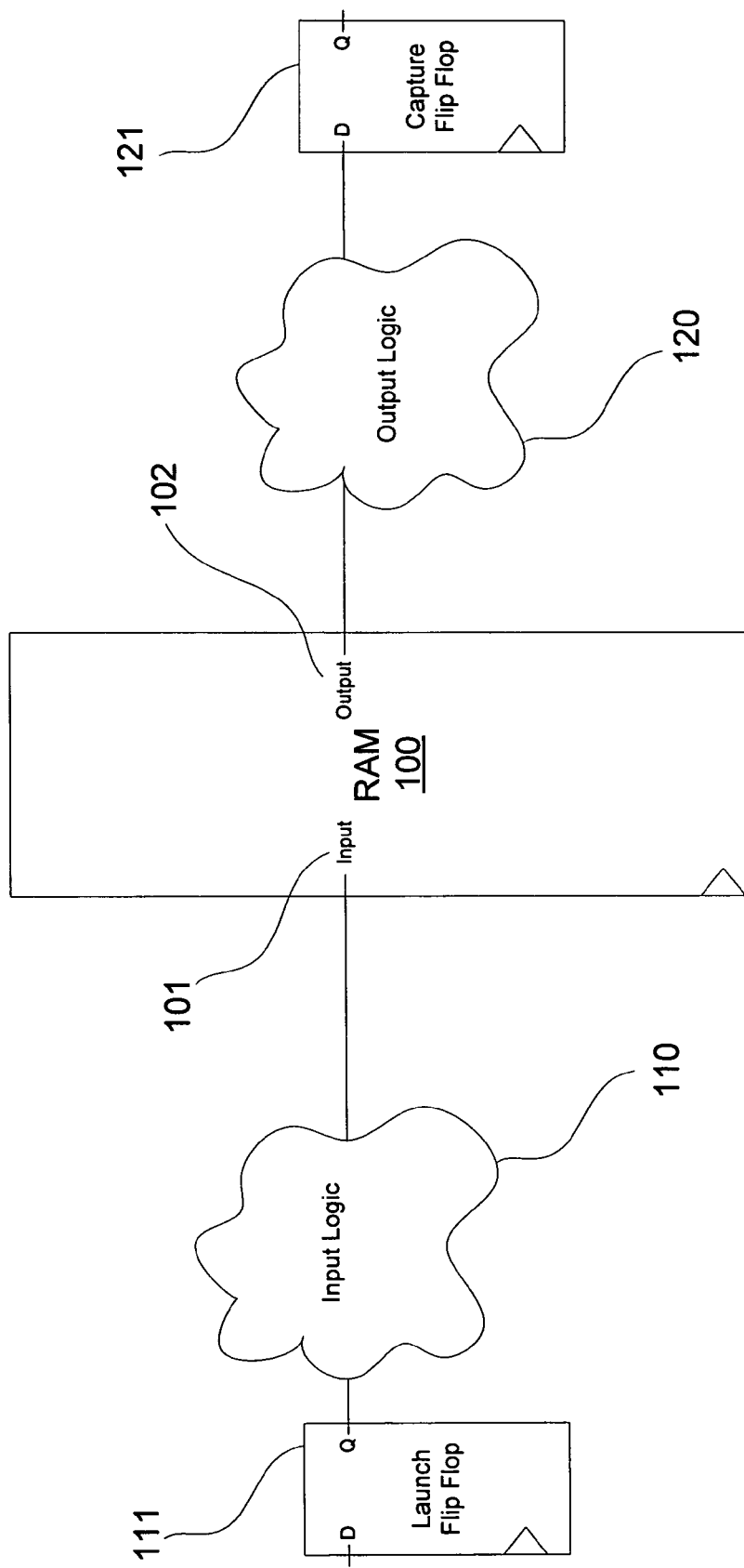
FIG. 1 is a schematic drawing of a conventional electronic circuit having a RAM block that includes associated input logic and output logic.
Figure 2:
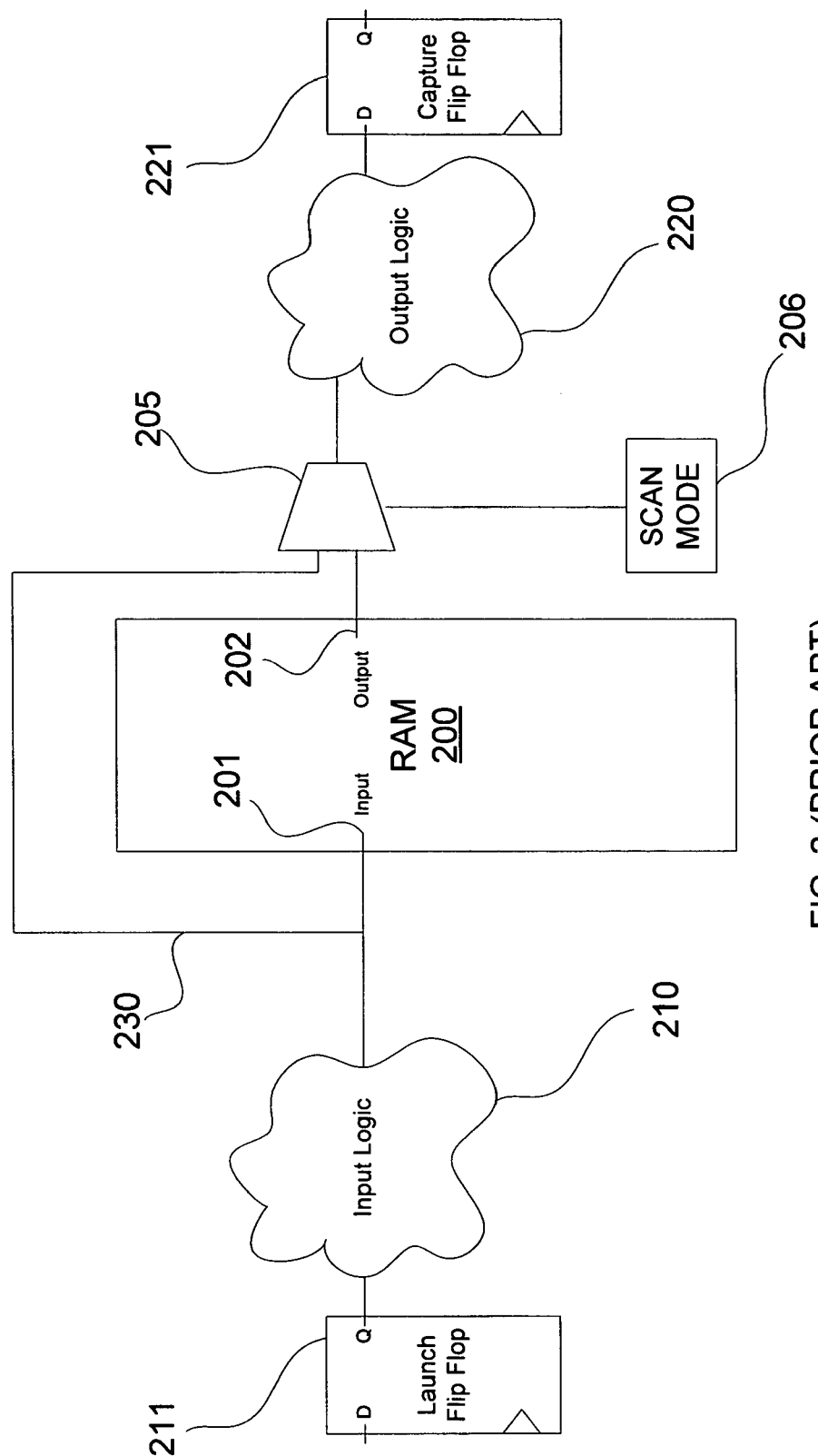
FIG. 2 is a schematic diagram of a conventional electronic circuit having a solution of the past that implements a multiplexor bypass circuit in conjunction with a RAM block.
Figure 3:
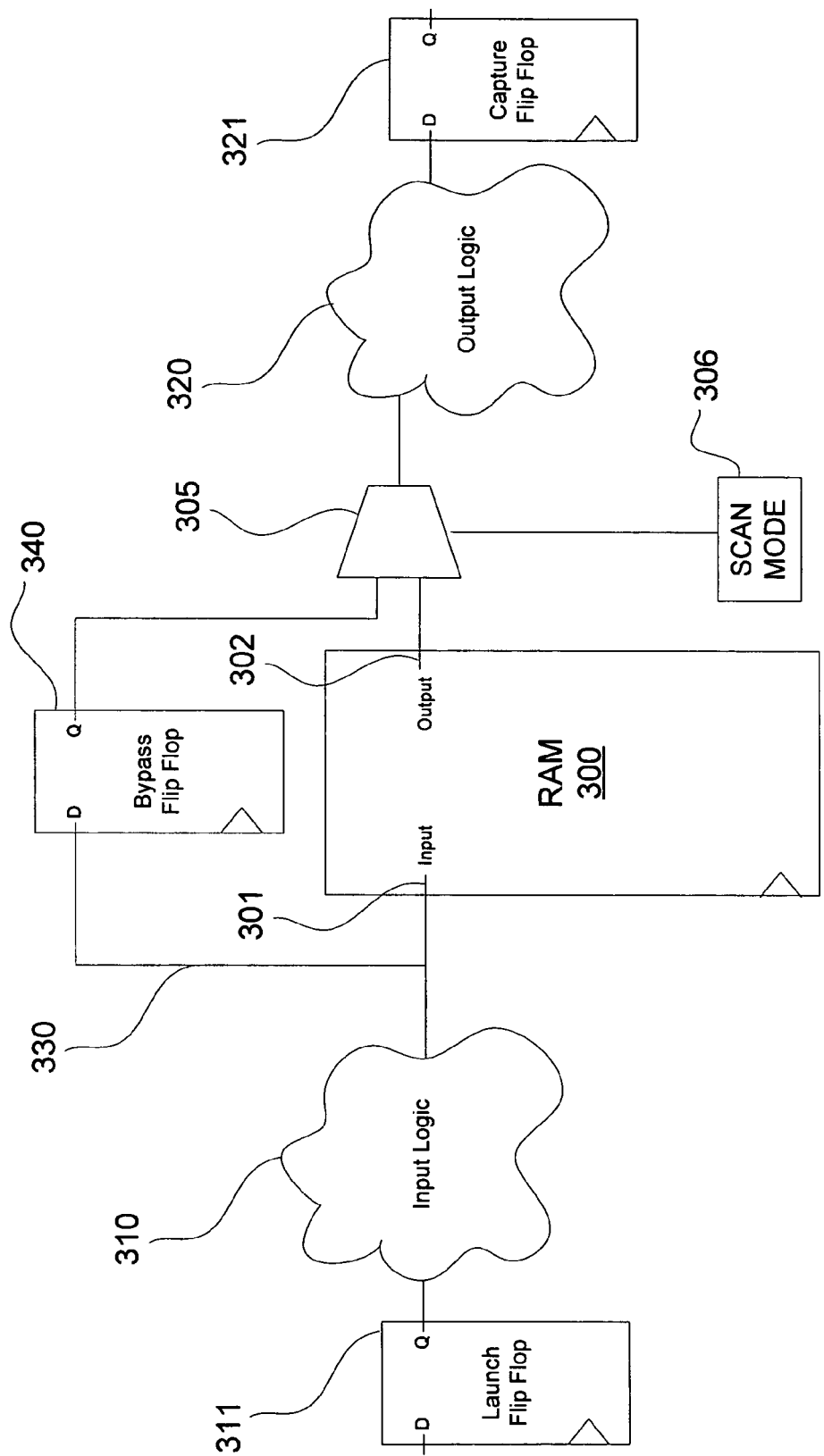
FIG. 3 is a schematic diagram of a conventional electronic circuit that includes a bypass flip-flop that solves the complex timing issues associated with the conventional electronic circuit of FIG. 2.
Figure 4:
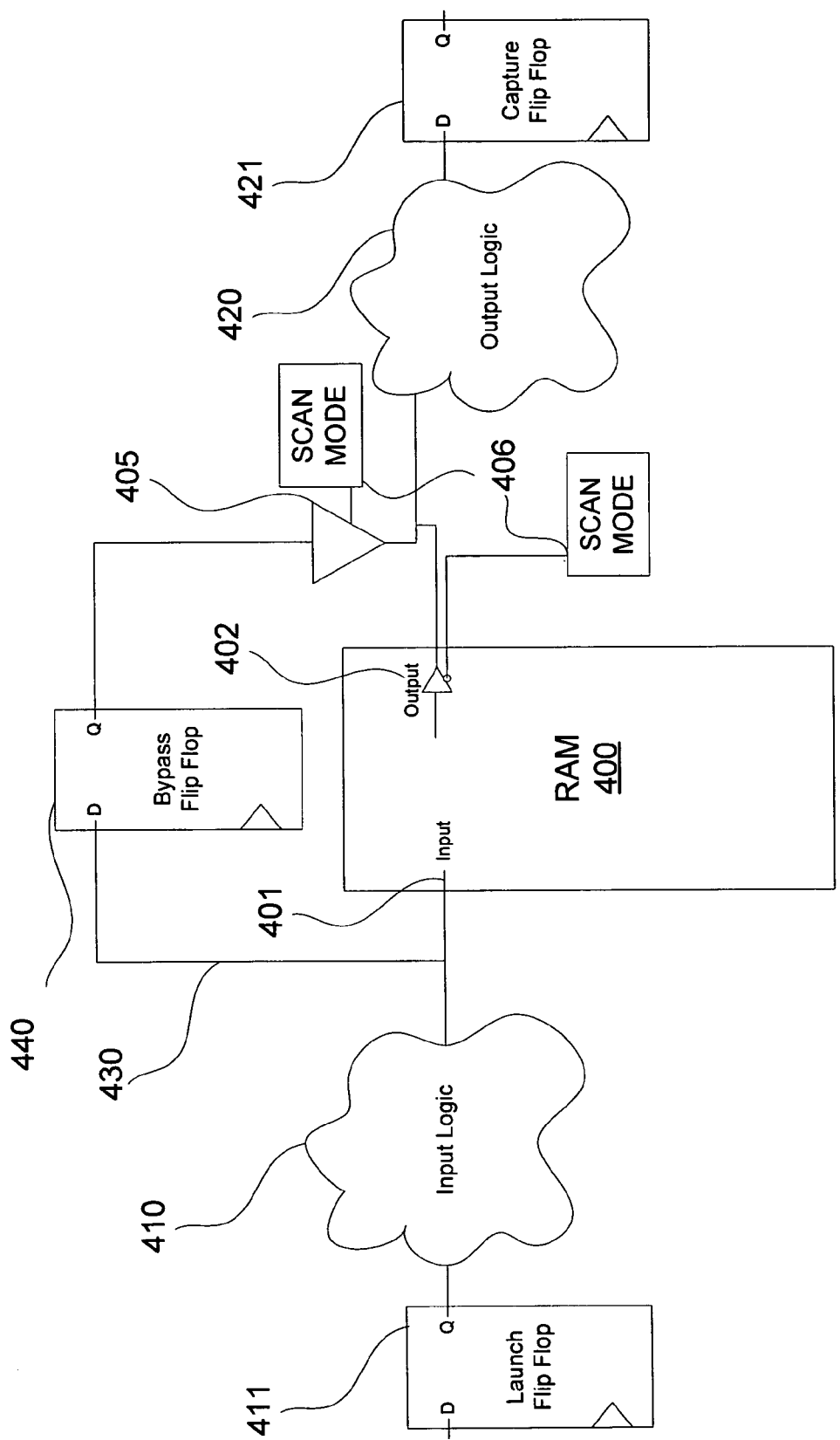
FIG. 4 is a schematic diagram of yet another conventional circuit for testing logic in a circuit that includes RAM blocks or other similar memory devices.
Figure 5:
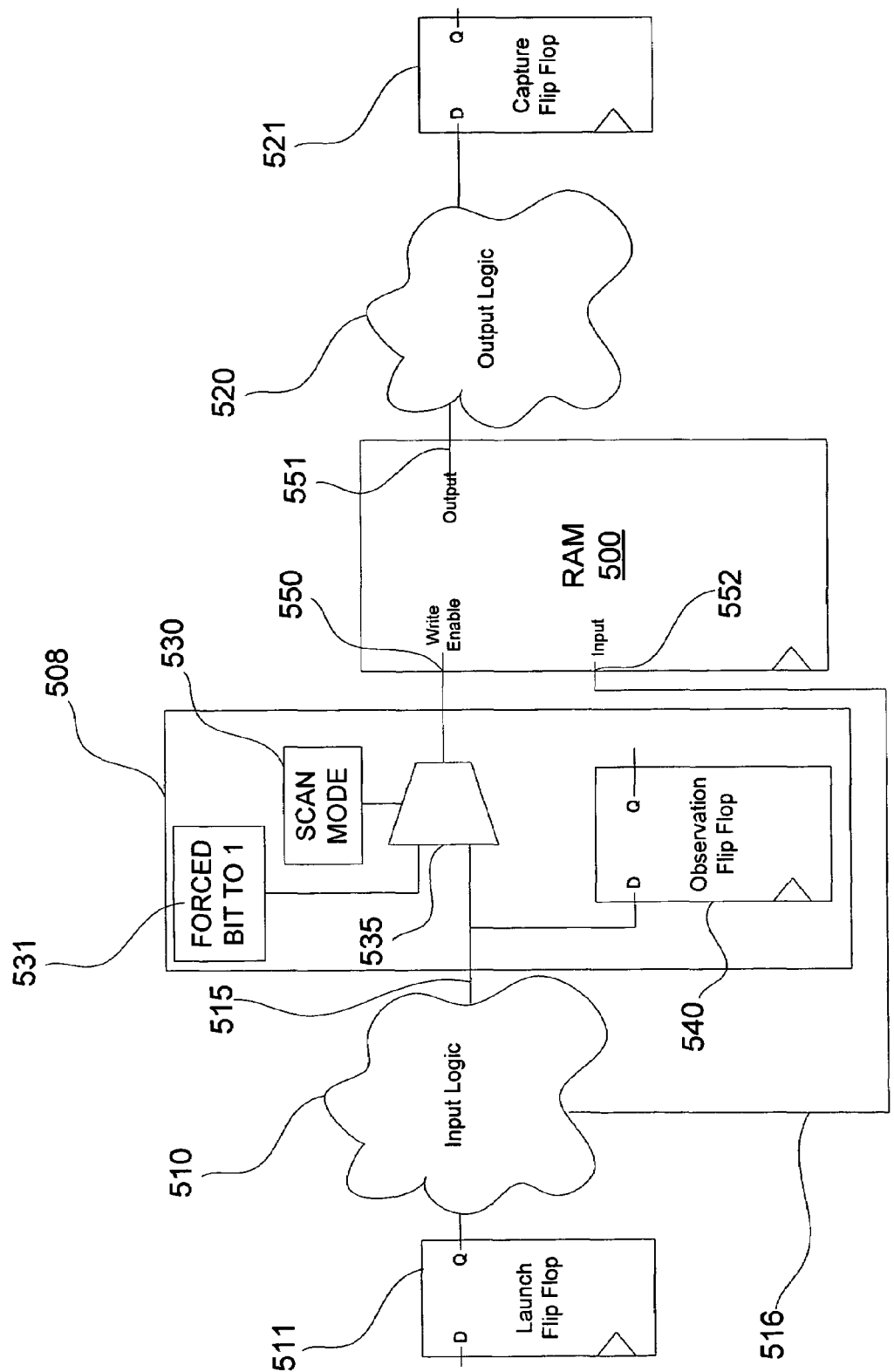
FIG. 5 is a schematic diagram of an electronic circuit having a write-enable bypass circuitry for testing logic according to an embodiment of the invention.

FIG. 5 is a schematic diagram of an electronic circuit having a write-enable bypass circuitry 508 for testing logic according to an embodiment of the invention. The electronic circuit includes typical elements associated with an ATPG such as launch flip-flop 511 and capture flip-flop 521. The electronic circuit to be tested resides between the launch flip-flop 511 and the capture flip-flop 521 and, in this embodiment, the electronic circuit to be tested includes input logic 510 and output logic 520 associated with a memory block, such as the RAM block 500. The electronic circuit also includes write-enable bypass circuitry 508. These elements and their relationships between each other are detailed in the following paragraphs.

As was discussed previously in the background section, it is extremely difficult to predict the logical outcome of values passed through a memory block in an electronic circuit using a scan vector test in an ATPG tester. As such, a reliable and predictable way of passing logical values either through or around the memory block is needed such that known values loaded at the launch flip-flop 511 will yield expected logical values at the capture flip-flop 521.

According to one embodiment of the invention, an off-the-shelf type of memory block that includes read-on-write capability is utilized. A memory block that has read-on-write capability, such as RAM block 500, monitors a specific write-enable input 550 to determine the operation of its input 552 and output 551. Although only one input 552 and one output 551 of the RAM block 500 is shown for clarity, it will be understood by those skilled in the art that there may be a plurality of inputs and a plurality of outputs with corresponding relationships that may include a one-for-one basis, one-to-many basis, etc., within the RAM block 500.

As such, some input/output aspects of the RAM block 500 will behave according to the logic value that is on the write-enable input 550. In one embodiment, if the write-enable input 550 is set to a high logic value, the output 551 of the RAM block 500 typically reflect the same logic value as on a corresponding input 552. That is, the RAM-block 500 performs a read-on-write such that any logic value received on an input 552 will be written directly through to a corresponding output 551 similar to the operation of a flip flop. On the other hand, if the write-enable input 550 is set to a low logic value, the output 551 of the RAM block 500 performs typical non-write operations according to the design and structure of the RAM block 500. Other alternatives include setting the RAM block 500 to normal operation when the write-enable input 550 is allowed to be controlled by the input logic 510. Although discussed in more detail below with respect to the operation of the embodiment of FIG. 5, memory blocks having read-on-write capability are well-known in the industry and will not be discussed in further detail herein.

As can be seen in FIG. 5, the write-enable input 550 is controlled by the write-enable bypass circuit 508. The write-enable bypass circuit 508 includes a bypass multiplexor 535 and an observation flip-flop 540. The bypass multiplexor 535 is configured to select a logic value observed on one of two inputs and to pass the logic value on the selected input to the write-enable input 550 which is connected to the output of the bypass multiplexor 535. The two inputs include a control line input 515 from the input logic block 510 and a forced high logic bit 531. As such, depending on the logic value of the scan mode bit 530, one input will be recognized while the other is ignored.

As such, in one embodiment, when the scan mode bit 530 is set to a high logic value, the bypass multiplexor 535 selects the input coupled to a forced high logic bit 531. In this case, since the forced high logic bit 531 remains at a high logic value (e.g., a value of one) at all times, a high logic value is passed through the bypass multiplexor 535 because the scan mode bit 530 is also set to a high logic value, which results in a high logic value at the write-enable input 550. Thus, any logic value received at the input 552 of the RAM block 500 is passed directly to a corresponding output 551 of the RAM block 500 because the write-enable input 550 is set to a high logic value.

On the other hand, when the scan mode bit 530 is set to a low logic value, the bypass multiplexor 535 selects the input coupled to a control line 515 from the input logic block 510. In this case, the logic value on the control line 515 from the input logic block 510 will be a function of the input logic block 510, itself, and may be a high logic value or a low logic value depending upon the requirements of the normal operations of the input logic block 510. That is, when not in scan mode, (i.e., the scan mode bit 530 is set to a low logic value), the electronic circuit behaves as though the write-enable bypass circuit 508 is not present. As such, any logic value received at the input 552 of the RAM block 500 through the input line 516 of the input logic block 510 is handled according to normal operating parameters of the RAM block 500 because the write-enable input 550 may be set to a low logic value. Likewise, any logic value on the control line 515 will also be passed to the write-enable input 550 through the bypass multiplexor 535 when the operation of the electronic circuit deems it necessary to set the write-enable input 550. Although not described herein, one skilled in the art may appreciate the need for using the write-enable function of the RAM block 500 outside of a testing environment as described herein.

The write-enable bypass circuit 508 further includes an observation flip-flop 540 for monitoring the logic value of the control line 515. As such, the input of the observation flip-flop 550 is coupled to the control line 515 of the input logic block 510. Likewise, the output of the observation flip-flop 550 is coupled to an observation point (not shown)

that is part of an ATPG (also not shown). In this manner, a technician employing the ATPG to perform a scan vector test is able to also monitor the control line 515 in order to verify its proper functioning since the scan mode bit 530 will be set to a high logic value during a scan vector test, (i.e., scan mode), thus forcing the write-enable input 550 to be a high logic value at all times because of the forced high value bit 531.

As discussed above, the write-enable bypass circuit 508 is only used in scan mode since its main purpose is control and observation of the RAM block inputs 552 and output 551 during scan mode. Furthermore, the timing of signals propagating through the electronic circuit in either scan mode or normal mode will be approximately two clock cycles.

In normal mode, during a first clock cycle, a logic value propagates to the input of the RAM block 500 through the input logic block 510 via the data line 516. Likewise, during a first clock cycle, a logic value propagates to the write-enable input 550 of the RAM block 500 through the input logic block 510 via the control line 515. The additional time that it takes logic value to pass through the bypass multiplexor 535 only impacts the write-enable path. None of the RAM block inputs 552 are impacted. Then, during a second clock cycle, the logic value received at the input 552 is handled by the RAM block 500 accordingly (which may or may not depend on the write-enable input 550) and a new logic value associated with the one received at the input 552 propagates from the output 551 of the RAM block 500 through the output logic 520. Thus, it is desirable that any testing of the electronic circuit is also accomplished in the same time frame (i.e., two clock cycles) as the normal mode timing.

When a technician needs to test the input logic 510 and output logic 520 using an ATPG, the technician may set the scan mode bit 530 to a high logic value wherein the write-enable bit 550 is also set to a high logic value at all times. Thus, when in scan mode, logic values that are initiated at the launch flip-flop 511 propagate normally through the input logic 510 and the data line 516 to the input 552 of the RAM block during a first clock cycle. Likewise, during a second clock cycle, the logic value received at the input 552 is handled by the RAM block 500 accordingly (which is to say that because the write-enable input 550 is set to a high logic value, the logic value at the input 552 is passed directly through to the output 551). The logic value passed through then propagates from the output 551 of the RAM block 500 through the output logic 520 to the capture flip-flop 521. Therefore, any testing of the logic is accomplished in the same time frame (i.e., two clock cycles) as the timing of the normal mode. That is, the scan test may be run at-speed.

Furthermore, the write-enable bypass circuitry 508 is not within the critical path of the electronic circuit. Thus, the critical path of the electronic circuit will remain as fast as possible while at the same time still having test circuitry (write-enable bypass circuitry 508) for testing the circuit at-speed.

Figure 6:
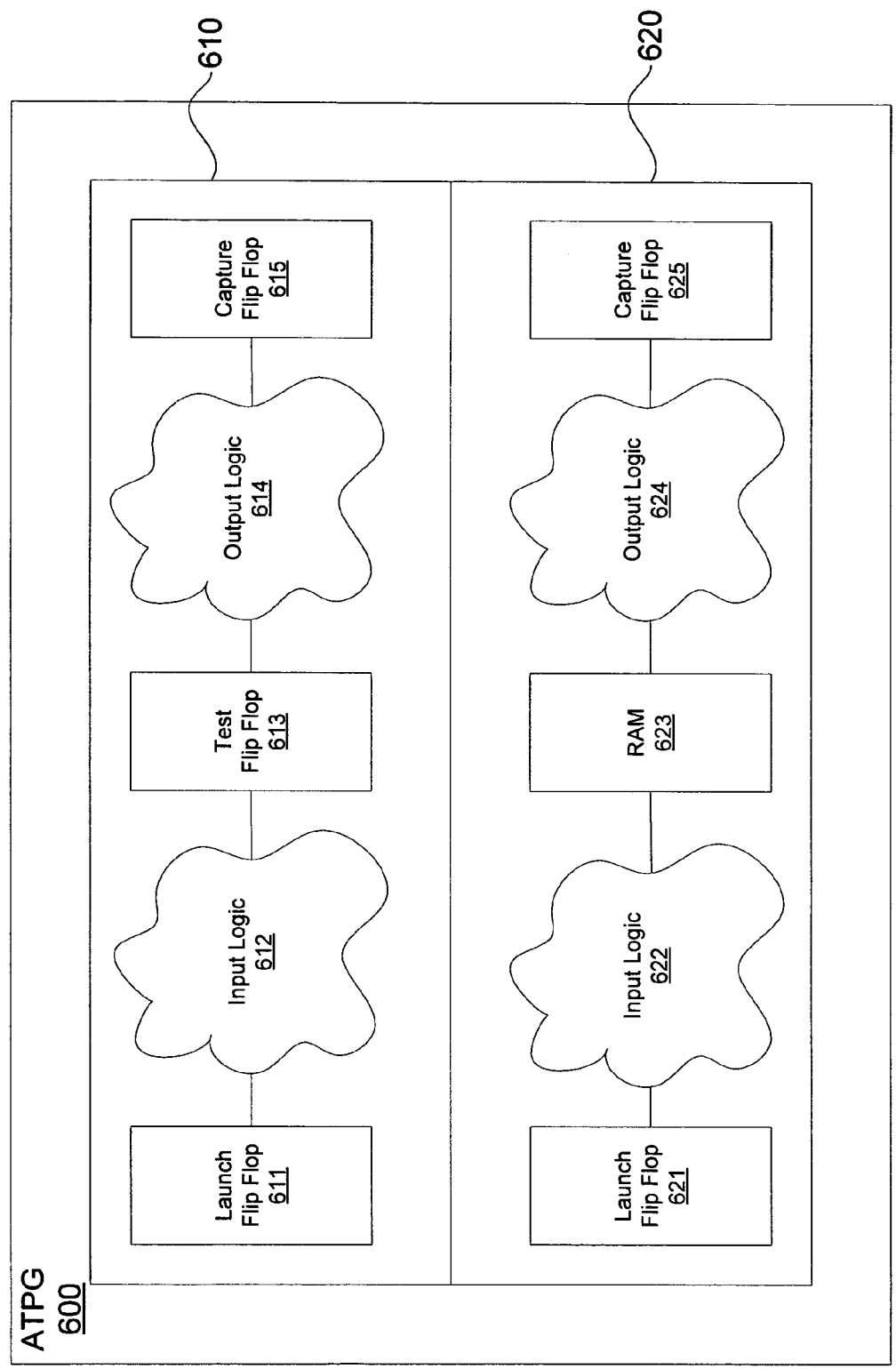
FIG. 6 is a block diagram of a typical ATPG that may be used in conjunction with the electronic circuit of FIG. 5 according to an embodiment of the invention.

FIG. 6 is a block diagram of a typical ATPG 600 that may be used in conjunction with the electronic circuit of FIG. 5 according to an embodiment of the invention. The ATPG 600 includes two test paths that may be used to compare a first electronic circuit against a standard test circuit or a second electronic circuit. As shown, the first path 610 includes a first launch flip-flop 611, a first input logic 612 a test flip-flop 613, a first output logic 614 and a first capture flip-flop 615. Likewise, the second path 620 also includes a second launch flip-flop 621, a second input logic 622, a second output logic 624, and a second capture flip-flop 615. Additionally, instead of a test flip-flop, the second path 620 includes a device between the input logic 622 and output logic 624, such as RAM block 623. The second input logic 622, the RAM block 623 and the output logic 624 may be similar to the electronic circuit of FIG. 5 and may also include the bypass circuitry 508 of FIG. 5.

As such, a technician may perform a scan vector test using the ATPG 600 of FIG. 6 on both the first path 610 and the second path 620. The results may be analyzed and compared according to known test procedures. Furthermore, each test may be performed at-speed such that testing is accomplished at the same speed in which the electronic circuit in either path would operate normally.

We claim:

1. An integrated circuit, comprising:
   a critical path that traverses a block of input logic, a memory block and a block of output logic, the memory block having a memory, at least one input and at least one output, the at least one input coupled to the block of input logic and the at least one output coupled to the block of output logic, the memory block also having a write-enable input; and
   a bypass circuit coupled to the write-enable input of the memory block and a control output of the block of input logic, the bypass circuit operable to verify the block of input logic and the block of output logic, such that when the bypass circuit is enabled responsive to a scan mode, a logic signal propagates along the critical path of the integrated circuit in a specified number of clock cycles and when the bypass circuit is disabled, the logic signal propagates along the critical path of the integrated circuit in the same specified number of clock cycles wherein the bypass circuit is exclusive of the critical path.

2. The integrated circuit of claim 1 further comprising:
   a launch flip-flop operable to force a logic value on at least one input through the block of input logic; and
   a capture flip-flop operable to read a logic value from at least one output through the block of output logic, wherein the bypass circuit is coupled to the block of input logic and the memory block and operable to receive a logic value from the block of input logic and a scan mode, and set the write-enable input.

3. The integrated circuit of claim 2 wherein the bypass circuit comprises:
   an observation flip-flop operable to receive the control output from the block of input logic; and
   a bypass multiplexor operable to pass the control output received at the observation flip-flop to the write-enable input.

4. The integrated circuit of claim 3 wherein the logic value received at the bypass multiplexor is only passed to the write-enable input when a scan mode bit is set to a low logic value.

5. The integrated circuit of claim 3 wherein the bypass multiplexor passes a high logic value to the write-enable input when a scan mode bit is set to a high logic value.

6. The integrated circuit of claim 3 wherein an output of the observation flip-flop is coupled to an observation point in an automatic test pattern generator.

7. The integrated circuit of claim 1 wherein the memory block comprises a random access memory block.

8. The integrated circuit of claim 1 operable to interface with an automatic test pattern generator and operable to be tested by a scan vector test.

9. In an electronic circuit, a method, comprising:
launching a test logic value from a launch flip-flop to a read-on-write memory block having a write-enable input through a block of input logic, and a bypass circuit coupled to a control output of the block of input logic and the write-enable input, wherein the memory block is coupled between the block of input logic and a block of output logic to form a critical path;
enabling the write-enable input on the memory block;
propagating the test logic value received at a memory block data input to a corresponding memory block output such that the number of clock cycles it takes the test logic value to traverse the critical path is not increased; and
reading the test logic value at a capture flip-flop coupled to an output of the block of output logic.

10. The method of claim 9 further comprising reading a control logic value on the control output, the control logic value responsive to operation of the block of input logic and the control logic value at an input to an observation flip-flop wherein the observation flip-flop comprises an output coupled to an observation point operable to interface with an automatic test pattern generator.

11. The method of claim 9 wherein the enabling the write-enable input on the memory block further comprises setting the write-enable input to a high logic value when a scan mode bit associated with the electronic circuit is set to a high value.

12. The method of claim 9 wherein the propagating the test logic value received at the memory block data input to the corresponding memory block output further comprises propagating the test logic value when the write-enable bit is set to a high logic value.

13. The method of claim 9, further comprising:
receiving the test logic value at an input of the memory block,
propagating the test logic value to a memory cell in the memory block when the write-enable bit is not set to a high logic value; and
propagating a second logic value associated with the test logic value received at the memory cell to the capture flip-flop through an output of the memory block.

14. The method of claim 13 wherein the test logic value propagates through the memory block to the capture flip-flop when the write-enable input is set to a high logic value in an equivalent number of clock cycles as the number of clock cycles that the test logic value propagates through the memory block to the capture flip-flop when the write-enable input is set to a low logic level.

15. An electronic circuit having a critical path that traverses a block of input logic, a memory block and a block of output logic, the electronic circuit, comprising:

a launch flip-flop having an input and an output operable to generate at least one logic value from a signal received at the input of the launch flip-flop;
an input logic block having an input, a data output, and a control output, the input of the input logic block coupled to the output of the launch flip-flop;
a memory block having a data input, a write-enable input, and an output, the data input of the memory block coupled to the data output of the input logic block;
an output logic block coupled to the memory block having an input and an output, the input of the output logic block coupled to the output of the memory block;
a capture flip-flop having an input and an output, the input of the capture flip-flop coupled to the output of the output logic block; and
a write-enable bypass circuit having an input and an output, the input of the write-enable bypass circuit coupled to the control output of the input logic block and the output of the write-enable bypass circuit coupled to the write-enable input of the memory block wherein the write-enable bypass circuit is exclusive of the critical path of the electric circuit.

16. The electronic circuit of claim 15 wherein the write-enable bypass circuit comprises:
an observation flip-flop having an input and an output, the input of the observation flip-flop coupled to the input of the write-enable bypass circuit; and
a bypass multiplexor having a first input, a second input, and an output, the first input coupled to the input of the write-enable bypass circuit and the output of the bypass multiplexor coupled to the output of the write-enable bypass circuit.

17. The electronic circuit of claim 16 wherein the second input of the bypass multiplexor is coupled to a forced bit.

18. The electronic circuit of claim 16 wherein the bypass multiplexor is operable to recognize the first input while ignoring the second input when a scan mode bit is set to a low logic value and recognize the second input while ignoring the first input when the scan mode bit is set to a high logic value.

19. The electronic circuit of claim 15 wherein the memory block is operable to pass a logic value received at the data input directly through to the output when the write-enable bit is set to a high logic value.

20. The electronic circuit of claim 15 wherein the memory block comprises memory cells, the memory cells operable to store the logic value received at the memory block when the write-enable bit is set to a high logic value.

* * * * *

UNITED STATES PATENT AND TRADEMARK OFFICE
CERTIFICATE OF CORRECTION

PATENT NO. : 7,281,178 B2
APPLICATION NO. : 10/892049
DATED : October 9, 2007
INVENTOR(S) : Michael Rencher Page 1 of 1

It is certified that error appears in the above-identified patent and that said Letters Patent is hereby corrected as shown below:

Col. 9 Line 36 In Claim 13, delete "block," and insert -- block; --, therefor.

Col. 10 Line 23 In Claim 15, delete "electric" and insert -- electronic --, therefor.

Signed and Sealed this

Twenty-fourth Day of February, 2009

JOHN DOLL
*Acting Director of the United States Patent and Trademark Office*